US010204811B2

(12) United States Patent
Duhamel et al.

(10) Patent No.: US 10,204,811 B2
(45) Date of Patent: Feb. 12, 2019

(54) SUBSTRATE TRANSPORT APPARATUS WITH ACTIVE EDGE GRIPPER

(71) Applicant: Brooks Automation, Inc., Chelmsford, MA (US)

(72) Inventors: Michael Duhamel, Acton, MA (US); Richard J. Pickreign, Harvard, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 145 days.

(21) Appl. No.: 14/148,785

(22) Filed: Jan. 7, 2014

(65) Prior Publication Data

US 2014/0119856 A1    May 1, 2014

Related U.S. Application Data

(63) Continuation of application No. 13/436,155, filed on Mar. 30, 2012, now Pat. No. 8,628,288, which is a continuation of application No. 11/093,481, filed on Mar. 30, 2005, now Pat. No. 8,167,522.

(51) Int. Cl.
*B65G 29/00* (2006.01)
*H01L 21/677* (2006.01)
*H01L 21/67* (2006.01)
*H01L 21/687* (2006.01)

(52) U.S. Cl.
CPC ...... *H01L 21/677* (2013.01); *H01L 21/67276* (2013.01); *H01L 21/67727* (2013.01); *H01L 21/68707* (2013.01); *Y10S 414/135* (2013.01)

(58) Field of Classification Search
CPC ..................................................... B65G 29/00

USPC ................................. 414/217, 783, 836, 941
See application file for complete search history.

(56) References Cited

U.S. PATENT DOCUMENTS

| | | | |
|---|---|---|---|
| 4,783,107 A | * | 11/1988 | Parker .................... B25J 13/082 294/213 |
| 6,167,322 A | | 12/2000 | Holbrooks |
| 6,216,883 B1 | | 4/2001 | Kobayashi et al. |
| 6,256,555 B1 | | 7/2001 | Bacchi et al. |
| 6,285,282 B1 | | 9/2001 | Dorenbosch et al. |
| 6,435,807 B1 | | 8/2002 | Todorov et al. |
| 6,489,745 B1 | | 12/2002 | Koreis |
| 6,547,510 B1 | | 4/2003 | Duhamel et al. |

(Continued)

OTHER PUBLICATIONS

Edel et al., Conception and Realization of an Intelligent and Autonomous End Effector Mar. 2-4, 1982, pp. 1-10.*

*Primary Examiner* — Saul Rodriguez
*Assistant Examiner* — Willie Berry, Jr.
(74) *Attorney, Agent, or Firm* — Perman & Green, LLP; Colin C. Durham (57) ABSTRACT

In accordance with one aspect of the exemplary embodiments, a substrate transport apparatus is provided comprising a drive mechanism, a movable arm assembly connected to the drive mechanism, an end effector connected to the arm assembly. A chuck for holding a substrate is mounted on the end effector and having a movable edge gripper with a contact surface and an edge of the substrate may be gripped by actuating the movable edge gripper to engage the substrate with the contact surface. The apparatus further comprising a motion sensor for providing a signal to actuate the movable edge gripper to close and open the moveable edge gripper for capturing and releasing the substrate.

17 Claims, 6 Drawing Sheets

(56) References Cited

U.S. PATENT DOCUMENTS

| | | |
|---|---|---|
| 6,623,235 B2 | 9/2003 | Yokota et al. |
| 6,635,818 B2 | 10/2003 | Ichiki et al. |
| 6,920,557 B2 | 7/2005 | Coffey et al. |
| 2002/0064450 A1 | 5/2002 | Commer et al. |
| 2003/0130759 A1 | 7/2003 | Kesil et al. |

* cited by examiner

SUBSTRATE TRANSPORT APPARATUS WITH ACTIVE EDGE GRIPPER

This application is a continuation of and claims the benefit of U.S. patent application Ser. No. 13/436,155, filed on Mar. 30, 2012, (now U.S. Pat. No. 8,628,288, issued on Jan. 14, 2014), which is a continuation of U.S. patent application Ser. No. 11/093,481, filed Mar. 30, 2005, (now U.S. Pat. No. 8,167,522, issued on May 1, 2012), the disclosures of which are incorporated herein by reference in their entireties.

BACKGROUND

1. Field of the Invention

The present invention relates to a substrate transport apparatus and, more particularly, to a semiconductor substrate transport apparatus with an active edge gripping end effector.

2. Brief Description of Earlier Related Developments

Integrated circuits are produced from wafers of semiconductor substrate material, such as silicon. Multiple integrated circuits are produced from each wafer. The typical fabrication facility is highly automated and uses substrate transport apparatus to transfer substrate wafers composed of partially fabricated integrated circuits between various fabrication tools.

To minimize defects in the integrated circuits, fabrication is carried out in clean rooms where specialized purification systems are employed to remove particle contaminates from the air and safeguards are used to prevent the creation of such contaminates. Dislocation of substrates during transport can cause particle contamination if the dislocated substrate strikes or rubs against another surface. In addition to damaging the dislocated substrate, other substrates can become contaminated with particles created due to the abrasion. Substrate transport apparatus with passive end effectors rely on friction between the end effector and the substrate to prevent dislocation, and therefore have lower operating speeds limited by the coefficient of static friction associated with the material of the passive pads (e.g. elastomeric material for low temperature conditions, or stainless steel, alumina, or quartz for high temperature conditions). Higher speeds are obtained by transport apparatus having active grip end effectors that apply a clamping force to the edge of a substrate as it is moved. Higher transport speeds are desired in the fabrication facility in order to increase production throughput.

Semiconductor substrate transport apparatus often operate within a chamber isolated to hold a controlled atmosphere, such as an inert gas or a vacuum. For example, a conventional substrate processing apparatus may comprise a vacuum chamber (or other chamber capable of holding an isolated atmosphere) with one or more processing modules capable of communicating with the chamber, and at least one load lock chamber to interface with the atmospheric environment outside. The apparatus further conventionally comprises a substrate transport apparatus with a movable arm for transporting substrates between the load lock chamber(s) and the processing modules, the arm being inside the vacuum chamber. It is desirable to use active edge grip end effectors on the transport apparatus for the above stated reasons. Active grip end effectors may employ a source of power and control to operate. In conventional transport apparatus cables extending through the apparatus to the end effector may be used for power or communication. Flexing of cables due to articulation of the transport apparatus can generate contamination particles, the insulation may give off unwanted gasses in a vacuum, and the cables must be adequately sealed where penetrating the chamber to maintain isolation of the controlled atmosphere. To minimize the length of cable runs and associated problems therewith, some conventional transport apparatus may employ slip rings at articulated joints, which in turn are also subject to particulate contamination generation along slip ring contact surfaces. Furthermore, slip rings are expensive, with a commensurate increase in cost of the transport apparatus. Moreover, the cables and/or conduits providing power and control to the end effector of conventional transport apparatus located in isolatable chambers form physical ties tying the conventional transport apparatus to the otherwise fixed power supply or control source. The corresponding result is that conventional transport apparatus in isolated chambers have a base that is fixed in place or has very limited linear transverse mobility. The exemplary embodiments of the present invention overcome the problems of the prior art as will be described further below.

SUMMARY OF THE EXEMPLARY EMBODIMENTS

In accordance with one aspect of the exemplary embodiments, a substrate transport apparatus is provided comprising a drive mechanism, a movable arm assembly connected to the drive mechanism, an end effector connected to the arm assembly. A chuck for holding a substrate is mounted on the end effector and having a movable edge gripper with a contact surface and an edge of the substrate may be gripped by actuating the movable edge gripper to engage the substrate with the contact surface. The apparatus further comprising a motion sensor for providing a signal to actuate the movable edge gripper to close and open the moveable edge gripper for capturing and releasing the substrate. The movable edge gripper is configured so that in response to a close signal from the motion sensor sensing motion of the end effector the movable edge gripper is actuated producing engagement and capture of the substrate and in response to an open signal from the motion sensor sensing motion of the end effector the movable edge gripper is actuated producing disengagement from and release of the substrate.

BRIEF DESCRIPTION OF THE DRAWINGS

The foregoing aspects and other features of the present invention are explained in the following description, taken in connection with the accompanying drawings, wherein.

DETAILED DESCRIPTION

Figure 1:
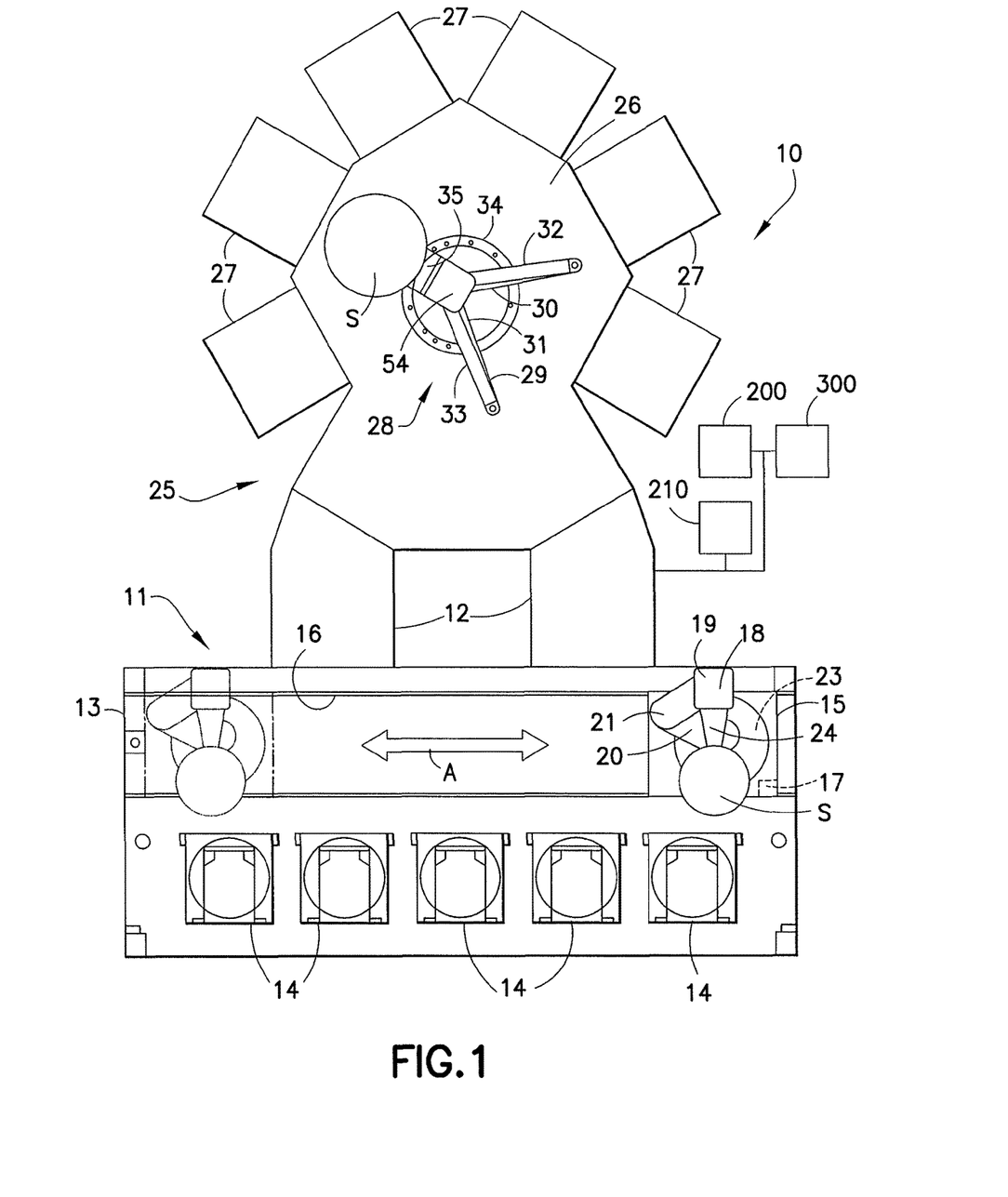
FIG. 1 is a top plan view of a substrate processing apparatus incorporating features of the present invention.

Referring to FIG. 1, there is shown a top plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape, or type of elements or materials could be used.

Figure 2:
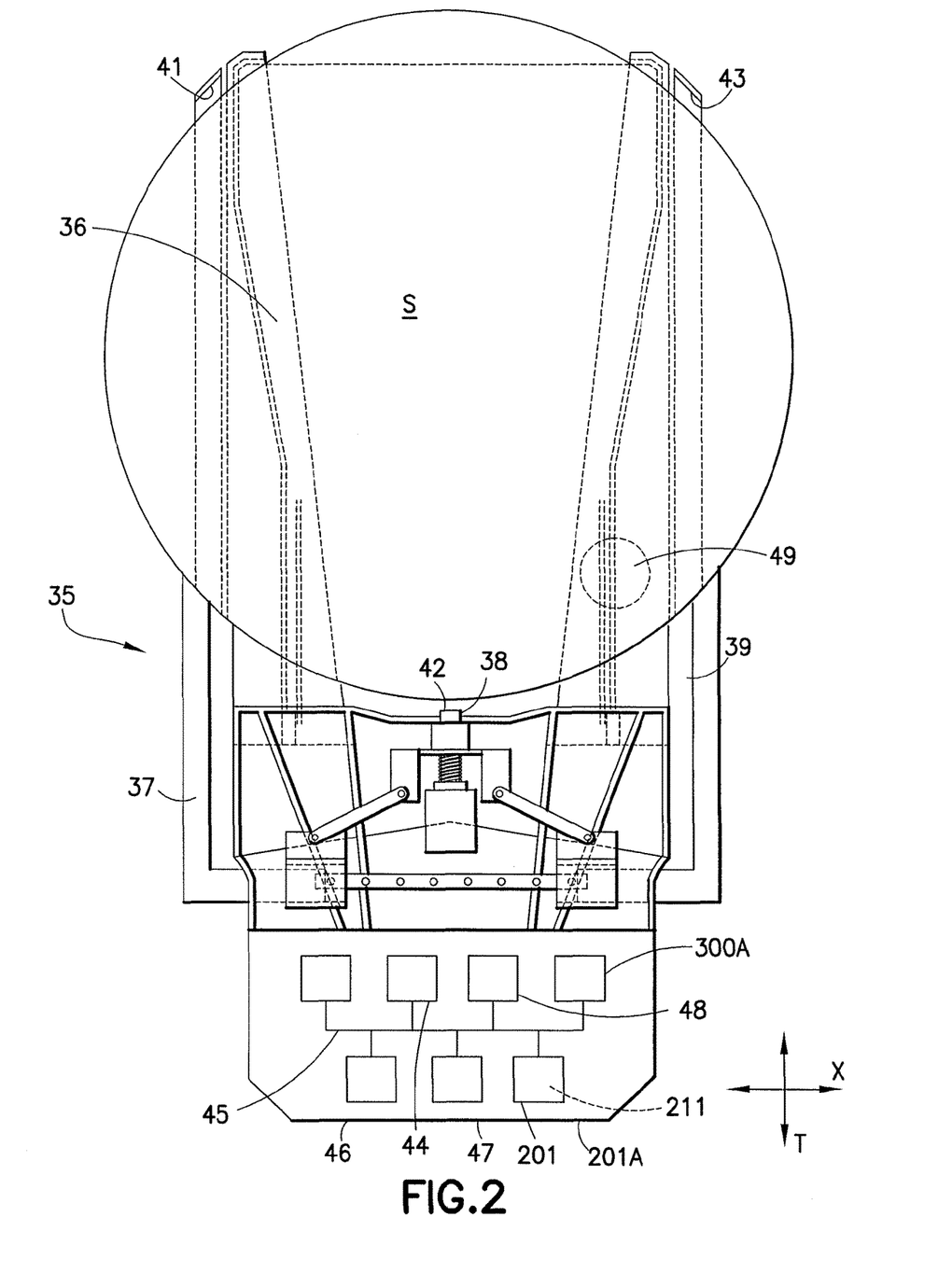
FIG. 2 is a top plan view of an end effector of the substrate transport apparatus in FIG. 1, and a substrate S.

In this embodiment, the substrate processing apparatus 10 generally includes a front end 11 and a back end 25, connected by load locks 12. In the exemplary embodiment shown in FIG. 1, the apparatus is a representative apparatus and is depicted as having a general cluster tool configuration for example purposes. The present invention is equally applicable to any other suitable processing apparatus as will be described below. The back end 25 of apparatus 10 may comprise a transfer chamber 26 capable of holding an isolated atmosphere such as a vacuum or inert gas. The back end may include a transfer chamber substrate transport apparatus 28 which transports substrates within the transfer chamber, to and from the load locks 12 and processing modules 27. The apparatus may have a controller 300 for controlling operation of the apparatus. The transport apparatus 28 may incorporate wireless features for actuation of an active edge grip mechanism for gripping a substrate on the end effector 35. Referring now to FIG. 2, the transport apparatus 28 may also have a motion sensor 44 for sensing motion of the transport apparatus and controlling actuation of the grip mechanism in response to the motion sensor sensing motion of the apparatus. The transport apparatus grip may communicate via a wireless communication device 201 on the transport apparatus for receiving a signal to actuate the grip mechanism. The transport apparatus may further have a wireless communication device 211 for receiving a wireless signal to power actuation of the grip mechanism. In this embodiment, the substrates may be 300 mm silicon wafers. However, in alternate embodiments the substrates may be of any other type including 200 mm or 150 mm wafers of any desired materials, masks, reticles, or flat panels for flat panel displays.

Referring again to FIG. 1, the front end 11 may be an environmental front end module (EFEM) that generally comprises a frame 13, a car 15, a track 16, and a front end substrate transport apparatus 18. A portion of the frame 13 is adapted to hold substrate cassettes 14. The substrate cassettes 14 are well know in the art and may hold, for example, thirteen or twenty-six silicon wafers. The track 16 is also connected to the frame 13. The car 15 rides on the track 16 and is translated by a drive system 17 in a linear motion along pathway A.

The front end substrate transport apparatus 18 incorporates a scara arm in this exemplary embodiment. Scara arms are described in U.S. Pat. No. 5,765,983, which is hereby incorporated by reference in its entirety. The transport apparatus 18 comprises a drive system 23 and a movable arm assembly 19. The movable arm assembly 19 may have a general articulated three link arrangement (e.g. upper arm 20, forearm 21, and end effector 24) with two or three independent degrees of freedom. Other embodiments may use an arm having any suitable configuration, such as the frogleg configuration described below, a six degree of freedom robot arm, or any other suitable design.

The front end substrate transport apparatus 18 may be used for the loading and unloading substrates to and from the back end 25 of the substrate processing apparatus 10. Generally, one or more cassettes 14 may be located on the frame 13 and removably supported by the frame as shown. At least one of the cassettes 14 may be for holding substrates ready to be processed. Another cassette 14 may be for holding substrates that have already been processed. As noted before, the back end 25 is isolated from the front end 11 as well as the exterior environment. Substrate transfer between back and front ends may be accomplished via load lock(s) 12. In this embodiment, two load locks are shown for example purposes, though in alternate embodiments more or fewer load locks may be used. One of the load locks may be used for transferring substrates to the back end 25 for processing, and the other load lock 12 may be used for returning substrates to the front end 11 after processing in the back end 25. The front end transport apparatus 18 may remove a substrate S from a cassette 14, holding unprocessed substrates, onto its end effector 24 and, through a combination of movement of the movable arm assembly 19 and translation of the car 15 along the path A, place the substrate into one of the load locks 12. Similarly, the robot may remove a processed substrate from the other load lock 12 and, through a combination of movement of the movable arm assembly 19 and translation of the car 15 along the path A, place the substrate into another of the cassettes 14. A separate substrate transport device may be used to convey the cassettes 14 to and from the frame 13, or they may be carried by a human. In alternate embodiments of the present invention, the cassettes 14 may themselves be loaded and unloaded through the load locks 12, carrying substrates with them.

As noted before, the back end 25 in this embodiment is depicted for example as a cluster tool comprising a transfer chamber 26 that is capable of holding an isolated atmosphere, for example a vacuum. In this embodiment, a number of processing modules 27 are located at the periphery of the transfer chamber 26 for performing various operations on the substrate that may include material deposition, etching, thermal processing, cooling, or other operations. In alternate embodiments more or fewer modules may be used.

A transfer chamber substrate transport apparatus 28 operates within the transfer chamber to transfer substrates between the various processing modules 27 and the load locks 12. The transfer chamber substrate transport apparatus 28 comprises a drive mechanism 34 and a movable arm assembly 29. The drive mechanism 34 is located external to and below the transfer chamber 26, and is connected to the transfer chamber in a manner that maintains the isolation of the transfer chamber. The movable arm assembly 29 is connected to the drive mechanism 34 at its proximal end and mounted within the transfer chamber 26. The end effector 35 is located at the distal end of the movable arm assembly 29 and is carried in the transfer chamber 26 by the movable arm assembly. The arm assembly 29 in this exemplary embodiment may have a frogleg configuration such as disclosed in U.S. Pat. No. 4,666,366 or U.S. Pat. No. 4,909,701 which are hereby incorporated by reference in their entireties. In alternate embodiments, any suitable type of transport apparatus may be used, such as a scara arm or a six degree of freedom arm.

In this embodiment, the movable arm assembly 29 comprises two upper arms 30,31 and two forearms 32,33. The arm assembly 29 has an end effector 35 depending from the forearms. Each of the two upper arms 30,31 is rotatable through an axis at its proximal end. These two axes are parallel and a fixed distance apart. The distal end of the first upper arm 30 is rotatably connected to the proximal end of the first forearm 32 forming a first elbow. Similarly, the distal end of the second upper arm 31 is rotatably connected to the proximal end of the second forearm 33, forming a second elbow opposite the first. The distal ends of the forearms 32,33 are rotatably connected to the wrist 54 at axes through their respective distal ends. The axes are parallel and a fixed distance apart. The proximal ends of the upper arms 30,31 are operably connected to the drive mechanism 34 and to each other such that when the movable arm assembly 29 is extended or retracted the rotational motion of the first upper arm 30 about its proximal end is opposite in direction to the rotational motion of the second upper arm 31 about its proximal end, causing the extension or retraction.

Referring again to FIG. 2, there is shown a top plan view of the end effector 35 and a substrate S supported by the chuck 36 of end effector 35. To engage and grip the substrate, movable edge grippers 37, 38 and 39 are moved toward the substrate by the motion of an actuator 40 and associated mechanical linkages, causing the respective contact pads 41, 42 and 43 to engage the edge of the substrate. Backside contact pads (not shown) may be located on the end effector 35 to support the substrate when the active grip mechanism is totally released. The edge contact pads 41, 42 and 43 may each comprise an upper and lower lip forming an included angle therebetween, the substrate edge being held within the included angle. A suitable example of an active grip mechanism is disclosed in U.S. patent application Ser. No. 10/196,679 (filed on Jul. 15, 2002) which is hereby incorporated by reference in its entirety. In alternate embodiments, the end effector may have any other suitable active edge grip mechanism and may use an actuator of any suitable type such as a solenoid or a piezoelectric device, or may use no actuator at all. For example, the active grip mechanism may have a single plunger mounted near the wrist that urges the substrate against a passive contact pad when actuated.

Still referring to FIG. 2, a motion sensor 44, for example an accelerometer, is mounted on the movable arm assembly 29. The motion sensor 44 is capable of sensing motion of the end effector 35 along desired axes. In this exemplary embodiment the motion sensor is more specifically located on the end effector 35, but in alternate embodiments the motion sensor may be located elsewhere on the movable arm assembly 29. In other alternate embodiments the motion sensor may be located apart from the movable arm assembly, for example on the transport chamber housing. As noted before, the motion sensor 44 may be an accelerometer. It may be of any suitable type, such as capacitive, piezoresistive, or servo-electric. The accelerometer may be a micro electro-mechanical system, may be incorporated in an integrated circuit and may be produced by surface microlithography or micro-machining. In alternate embodiments, any other suitable type of motion sensor may be used, such as a proximity influence sensor, a sensor using a reflected beam or through beam to detect motion of the end effector, or a system wherein optical, acoustic, or radio interferometry is used to sense motion of the end effector.

Figure 3:
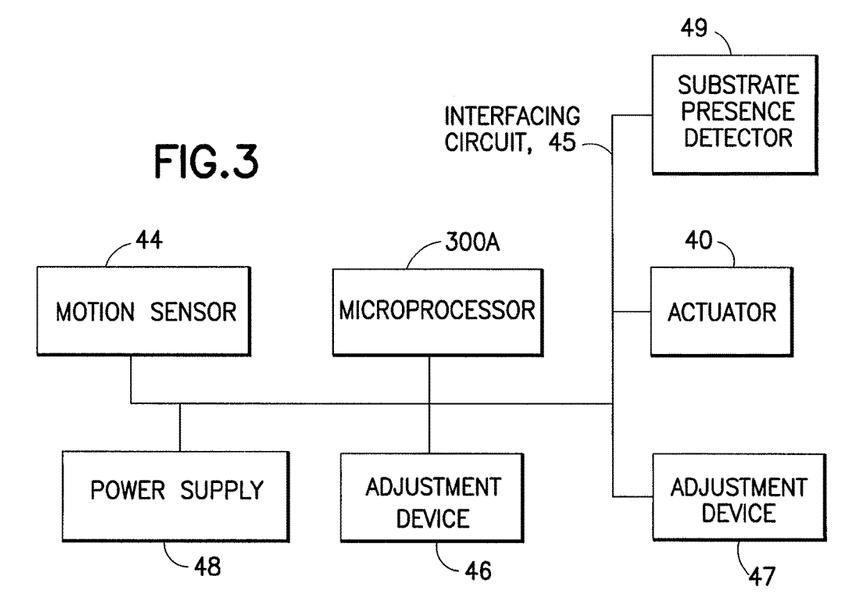
FIGS. 3-3A are schematic block diagrams of a substrate grip operating system of the end effector in FIG. 2.

The motion sensor 44 is operably connected to an interfacing circuit 45 and via the circuit 45 to controller 300 (see FIG. 1) that actuates the movable grippers 37,38, and 39 using the actuator 40 as will be described further below. As seen in FIG. 2, at least a portion of the interfacing circuit 45 is located on the movable arm assembly 29 and the circuit operably connects the various electrical components carried by the arm such as the motion sensor 44, a power supply 48, a microprocessor 300A, a threshold adjuster 46, a grip force adjuster 47, a wireless communications device for communicating information 201, a wireless communication device for communicating power 211, and a substrate presence detector 49. The interfacing circuit 45 may be defined by electrically conductive traces on a printed circuit board. The interfacing circuit 45 could be an analog circuit or a digital device. The interfacing circuit 45 may be wired or may be, at least in part, wireless. FIG. 3 is a schematic block diagram showing the on board devices mounted on arm assembly 2a and connected by interfacing circuit 45, that defines at least a portion of the gripper operating system in the exemplary embodiment. In alternate embodiments one or more of the motion sensor 44, power supply 48, microprocessor 300A, threshold adjuster 46, grip force adjuster 47, wireless communications device for communicating information 201, wireless communication device for communicating power 211, and substrate presence detector 49 may not be carried by the movable arm assembly 29.

As previously stated, the interfacing circuit 45 may connect the motion sensor 44 to a microprocessor 300A mounted on arm assembly 29 as shown in FIG. 2. The microprocessor may include programming to register and interpret data embodied in the motion sensor signal and may have a program to operate the actuator in response to a desired signal from the motion sensor 44. A mobile power supply 48 is located on the movable arm assembly for powering electrical devices including the accelerometer 44, interfacing circuit 45, substrate presence detector 49 and linear actuator 40. The power supply 48 stores energy and releases it in the form of AC or DC current. The power supply for example may be a battery, high-capacity capacitor or any other suitable device, and may be removably mounted to allow replacement when spent. The power supply may also have a suitable coupling or interface for linking to charging devices to recharge the power supply as desired.

Figure 3A:
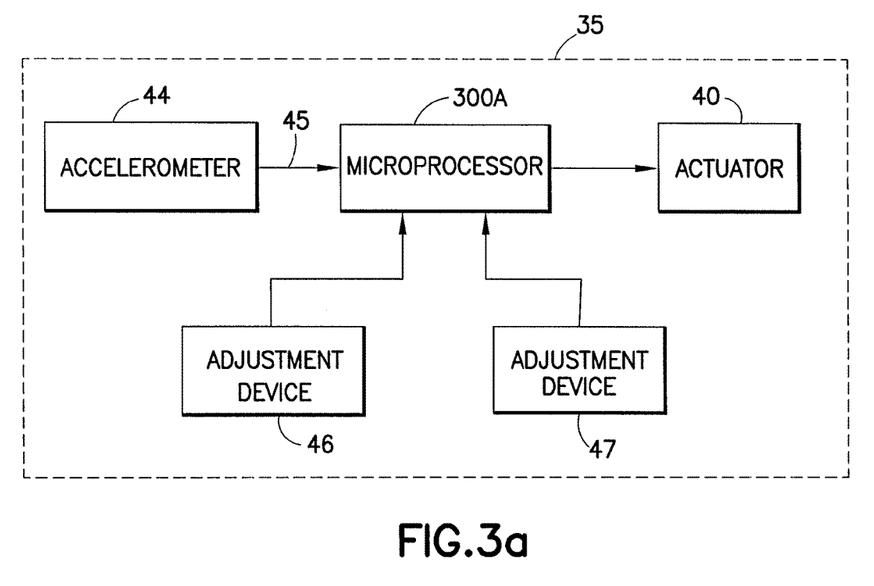

Referring now also to FIG. 3A, there is shown another schematic block diagram illustrating the operating mode of the grippers on end effector 35 in this exemplary embodiment. As shown in FIG. 3a, the on board microprocessor 300A controls actuation of the gripping mechanism in response to signals from motion sensor 44 communicated to the microprocessor directly via the interfacing circuit 45, without any signaling between the movable arm assembly 29 and any controller or other device outside the isolated transfer chamber. The motion sensor 44 outputs a suitable signal, representative of sensed motion of a desired portion of the arm assembly 29 to allow detection of motion of the end effector. For example, if the motion sensor 44 includes an accelerometer on the end effector, the sensor output signal may be a voltage difference to ground that is proportional to the measured acceleration in some direction. The motion sensor 44 may sense acceleration in at least two independent directions likely to cause dislocation of the substrate on the chuck 36, for example directions coplanar with the end effector, such as along orthogonal axes (X,T) shown in FIG. 2. This allows the total magnitude of acceleration within the plane of motion of the end effector to be calculated and used to actuate the edge gripping mechanism. Output signals from the accelerometer 44 serve as inputs via the interfacing circuit 45 to the microprocessor 300A (and to controller 300 if desired as will be described below). Upon registering that the magnitude of the sensed acceleration exceeds a predetermined level, the microprocessor 300A actuates the movable edge grippers 37,38 and 39 with a predetermined amount of clamping force. Conversely, when the magnitude of the measured acceleration no longer exceeds a predetermined level, the movable edge grippers 37,38 and 39 are released. Thus in this mode of operation the transport apparatus may be operated at levels of acceleration that exceed acceptable levels for passive end effectors. The movable edge grippers 37, 38 and 39 are automatically actuated to securely clamp the substrate S in place when inertial forces would otherwise cause a dislocation. As may be realized, the movable edge grippers 37, 38 and 39 are in a released state when acceleration is low, in a direction that will not generate substrate dislocation, or the end effector is stationary, allowing the substrate to be placed onto or removed from the end effector 35. As will be described in greater detail below, actuation of the grippers 37, 38 and 39 of the arm assembly 29 may be accomplished without providing a control cable extending through or along the movable arm assembly 29 and spanning across articulated joints from another location and without communicating control signals to the movable arm assembly across the boundary defined by the isolated transfer chamber. The motion sensor actuated active grip system described herein is not limited to use in a vacuum and may be implemented on various types of substrate transport apparatus including the atmospheric front end substrate transport apparatus 18 of substrate processing apparatus 10.

As noted before, an adjustment device 46 may be located on the movable arm assembly 29 for setting a predetermined sensed acceleration threshold for actuating the movable edge grippers 37,38 and 39. An adjustment device 47 for setting a predetermined force to be applied to the substrate S during actuation of the movable edge grippers 37,38 and 39 may also be located on the arm assembly. These adjustment devices 46, 47 may be suitable input devices, connected by the interfacing circuit 45 to the microprocessor 300A (see FIG. 3). By way of example, the adjustment devices 46, 47 may be suitable EPROM devices, resident on the microprocessor or separate therefrom, programmed with the desired threshold values. The microprocessor programming accesses the threshold values in devices 46, 47 for operation of the grippers. The devices 46, 47 may be programmable in place or may be removable to allow offsite programming. In alternate embodiments, any other suitable adjustment devices may be used.

As illustrated in FIGS. 2-3, a substrate presence detector 49 is located on the end effector. In this exemplary embodiment the substrate presence detector 49 may be for example a capacitive proximity sensor, and is mounted on the end effector such that when a substrate is properly seated on the chuck, the substrate presence detector will detect the presence of the properly seated substrate. The substrate presence detector produces a signal that indicates the presence of a substrate when it is properly seated in the chuck. This signal is transmitted via the interfacing circuit 45. Programming of the controller 300 or microprocessor 300A will block actuation of the movable edge grippers 37, 38 and 39 in the absence of a signal indicating a present and properly seated substrate. In alternate embodiments, the substrate presence detector may be an inductive, optical, strain gauge, acoustical, or ultrasonic detector or any other suitable detector.

Referring to FIG. 3A in conjunction with FIGS. 1, 2 and 3, the substrate transport apparatus 28 may be operated as follows. During a substrate pick with end effector 35, the substrate presence detector 49 may detect the presence of the substrate S in the chuck 36 and communicate a signal indicating the presence of a substrate to the microprocessor 300A, and controller 300 if desired, via the interfacing circuit 45. As commanded by controller 300, the drive mechanism 34 may begin moving the arm 29 and thereby transporting the substrate S along a desired pathway. The motion sensor 44 may continuously monitors the acceleration of the end effector 35 and communicate this information to the microprocessor 300A via the interfacing circuit 45. The microprocessor 300A runs a program comparing the measured acceleration with the threshold level indicated by the adjustment device 46. When the measured acceleration exceeds the threshold level and the presence of the substrate has been registered, the microprocessor 300A sends a signal via the interfacing circuit 45 to the actuator 40 instructing actuation of the grip mechanism at the grip force level indicated by the adjustment device 47. The movable edge grippers 37, 38 and 39 are moved toward the substrate S, gripping the substrate and preventing dislocation of the substrate as it is transported. In a similar manner, the grip mechanism may be released when the measured acceleration falls below a preset level established as desired with adjustment device 46.

Figure 4:
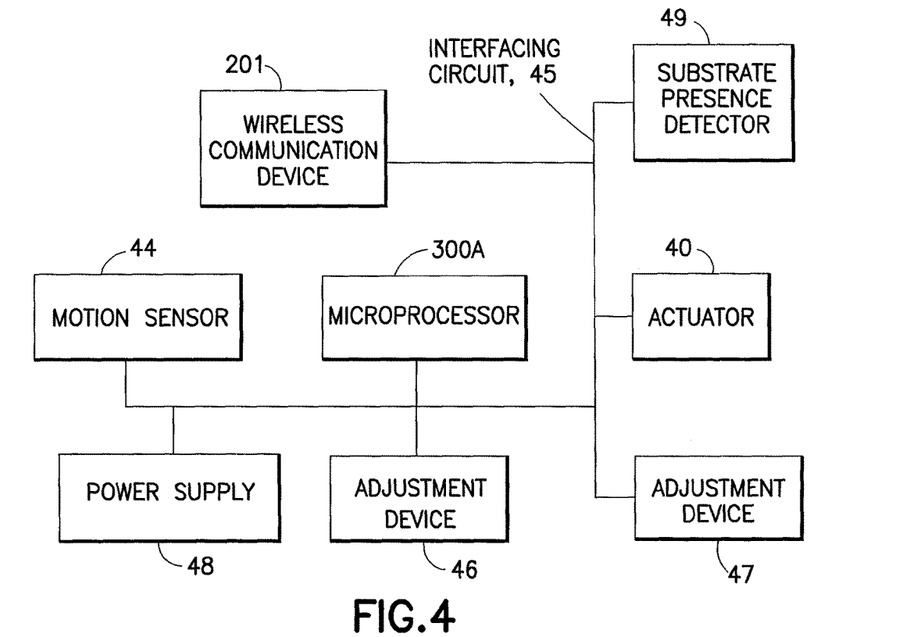
FIGS. 4-4A are schematic block diagrams of the substrate grip operating system of the end effector in accordance with another exemplary embodiment.
Figure 4A:
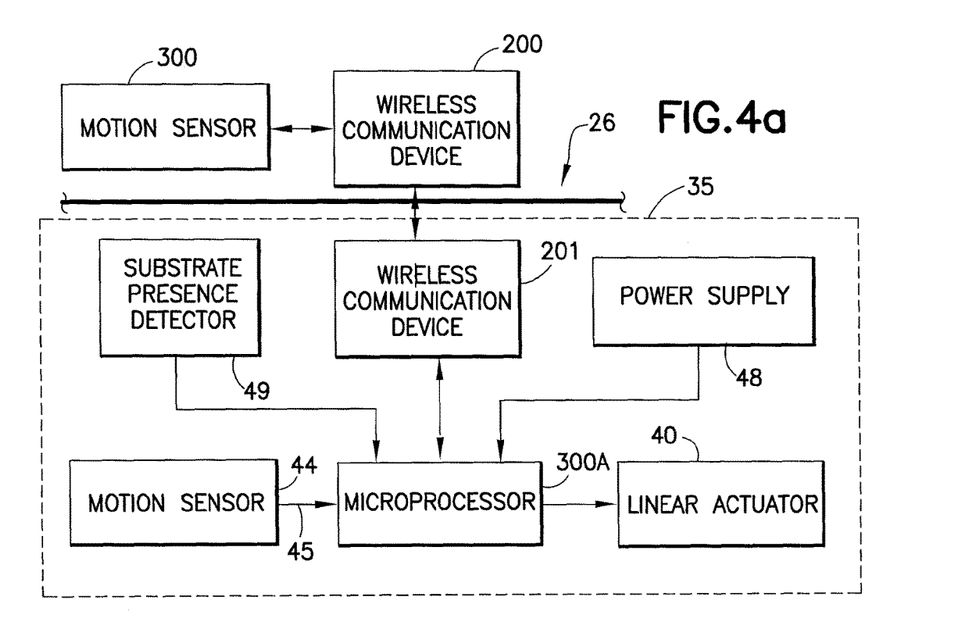

As seen in FIG. 4, in accordance with another exemplary embodiment, a wireless communication device 201 may be located on the movable arm assembly 29. For example the wireless communication device 201 may be positioned on the end effector such as in position 201A shown in FIG. 2. The wireless communication device 201 may be connected by the interfacing circuit 45 to the microprocessor 300A (which is capable of actuating the movable edge grippers 37, 38, and 39 via the interfacing circuit as described above). Wireless device 201 may be incorporated or otherwise integral with microprocessor 300A. Referring also to FIG. 4A, another wireless communication device 200 may be located outside of the transfer chamber 26 in this embodiment. The other wireless communication device 200 is capable of being communicably coupled to the wireless communication device 201 inside the isolated chamber 26. Accordingly, communication device 200 may include suitable receptors and transmission elements enabling wireless communication signals to be communicated across the sealed walls of the isolated chamber 26. The exterior wireless communication device 200 is also communicably connected to the controller 300 (see FIG. 4A). Thus, in this embodiment the controller 300 is communicably connected to the movable edge grippers 37, 38 and 39 via the wireless communication devices 200, 201, and the interfacing circuit 45 and capable of actuating the movable edge grippers.

In this embodiment the wireless communication device 201 on the end effector 35 may communicate with the other wireless communication device 200 outside the transfer chamber 26 through the transmission and reception of RF signals. For example the wireless communication device 201 may be communicably coupled with the other wireless communication device 200 via a Bluetooth® communication protocol. For example, the Bluetooth® communication protocol described in Bluetooth® Core Specification v2.0+ EDR dated Nov. 4, 2004 may be used. The Bluetooth® communication protocol may be used in the substrate processing apparatus 10 with a distributed or clustered control architecture that makes use of its ad hoc network forming ability.

The wireless communication device 201 on the end effector 35 and the other wireless communication device 200 located outside the transfer chamber 26 may be part of a communication network that includes other wireless communication devices or wired communication devices. In the exemplary embodiment, the wireless communication device 201 and the other wireless communication device 200 may be associated with other Bluetooth devices, collectively forming a piconet. In other alternate embodiments, other wireless networking protocols, such as IEEE 802.11 or a CDMA protocol may be used. In OTHER alternate embodiments the communication system may use different RF frequency ranges, or may employ non-RF wireless communications systems, such as infrared or visible wavelength optics.

Operation of the movable edge grippers 37, 38 and 39 in the embodiment shown in FIG. 4A may be similar to operation in previously described with reference to FIG. 3A except as otherwise noted. The signal generated by the motion sensor 44 indicating the acceleration of the end effector is wirelessly communicated to the controller 300 via the interfacing circuit 45 and wireless communication devices 200,201. The controller 300 may then compare the measured acceleration to a preset threshold level. If the measured acceleration exceeds the threshold level, the controller 300 may send a signal to the microprocessor 300A via the wireless communication devices 200, 201 instructing actuation of the active grip mechanism. The microprocessor may, as in the exemplary embodiment described previously, send a signal via the interfacing circuit 45 to the actuator 40 instructing actuation of the grip mechanism at the grip force level indicated by the adjustment device 47. The movable edge grippers 37, 38 and 39 may be moved toward the substrate S, gripping the substrate and preventing dislocation of the substrate as it is transported. In a similar manner, the grip mechanism may be released when the measured acceleration falls below a preset level.

Figure 4B:
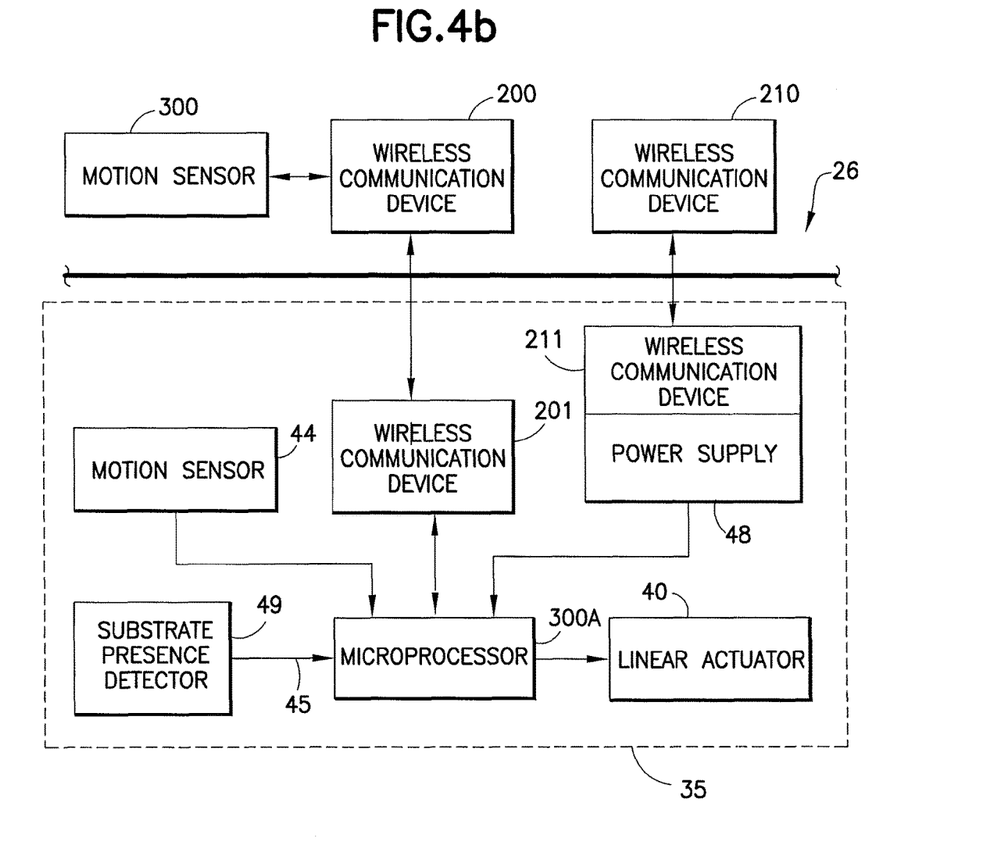
FIG. 4*b* is a schematic block diagram showing the grip operating system in accordance with yet another exemplary embodiment.

Referring now to FIG. 4B, in accordance with another exemplary embodiment a wireless communication device 211 may be located on the movable arm assembly 29, for example in location 201A on the end effector as shown in FIG. 2. In this embodiment, communication device 201 may also be mounted on the end effector. The wireless communication device 211 is capable of converting a received wireless signal into a form of power (for example electrical power) that can be used to operate the microprocessor 300A and actuate the movable edge grippers 37, 38 and 39. Another wireless communication device 210 is located at least partly outside of the isolated transfer chamber 26. The outer device 210 is configured to transmit the wireless signal to the wireless communication device 211 across the sealed walls of the isolated chamber. The wireless communication device 211 on the end effector 35 may be an RF receiver and the outer wireless communication device 210 may be an RF transmitter. The wireless communication device 211 converts the energy of the electromagnetic beam from device 210 into electrical energy. This electrical energy may be used for direct power actuation of the active edge grippers 37, 38 and 39 as well as other electrical devices located on the movable arm assembly 29 such as the motion sensor 44, the wireless communication device 201, and the substrate presence detector 49 via the interfacing circuit 45. The power supply 48 may act as a buffer, storing and releasing electrical energy as needed to insure a stable supply. The wireless communication device 211 may be an integral part of the power supply 48, or alternatively the power supply may be apart from the power supply 48. In alternate embodiments, the arm assembly may have no on board power supply, using power from wireless communication device 211 for powering actuation of the active edge gripping mechanism. In other alternate embodiments, the gripper operating system may use alternate arrangements to wirelessly communicate power, such as an optical beam received by a photovoltaic cell or inductive power transmission.

Still referring to FIG. 4B, the substrate transport apparatus 28 may be operated as follows. As noted before, power supply 48 may be a rechargeable battery. A charge may be maintained in the power supply 48 by periodic wireless power transfer to the end effector 35. Wireless power transfer may be accomplished as follows. The outer wireless communication device 210 may radiate electromagnetic energy in the RF frequency range. The wireless communication device 211 located on the arm 29 may receive at least some portion of this energy and convert it into an electrical current for the power supply 48. Wireless power transfer may be performed at any suitable time, such as when the transport apparatus is in a battery location or in a standby mode. Wireless power transfer may also be performed when the transfer apparatus is in full operational motion. Wireless transfer power may be performed continuously, or intermittently. Suitable shielding may be incorporated in the chuck to protect substrates from electromagnetic discharges from power signals.

Figure 5:
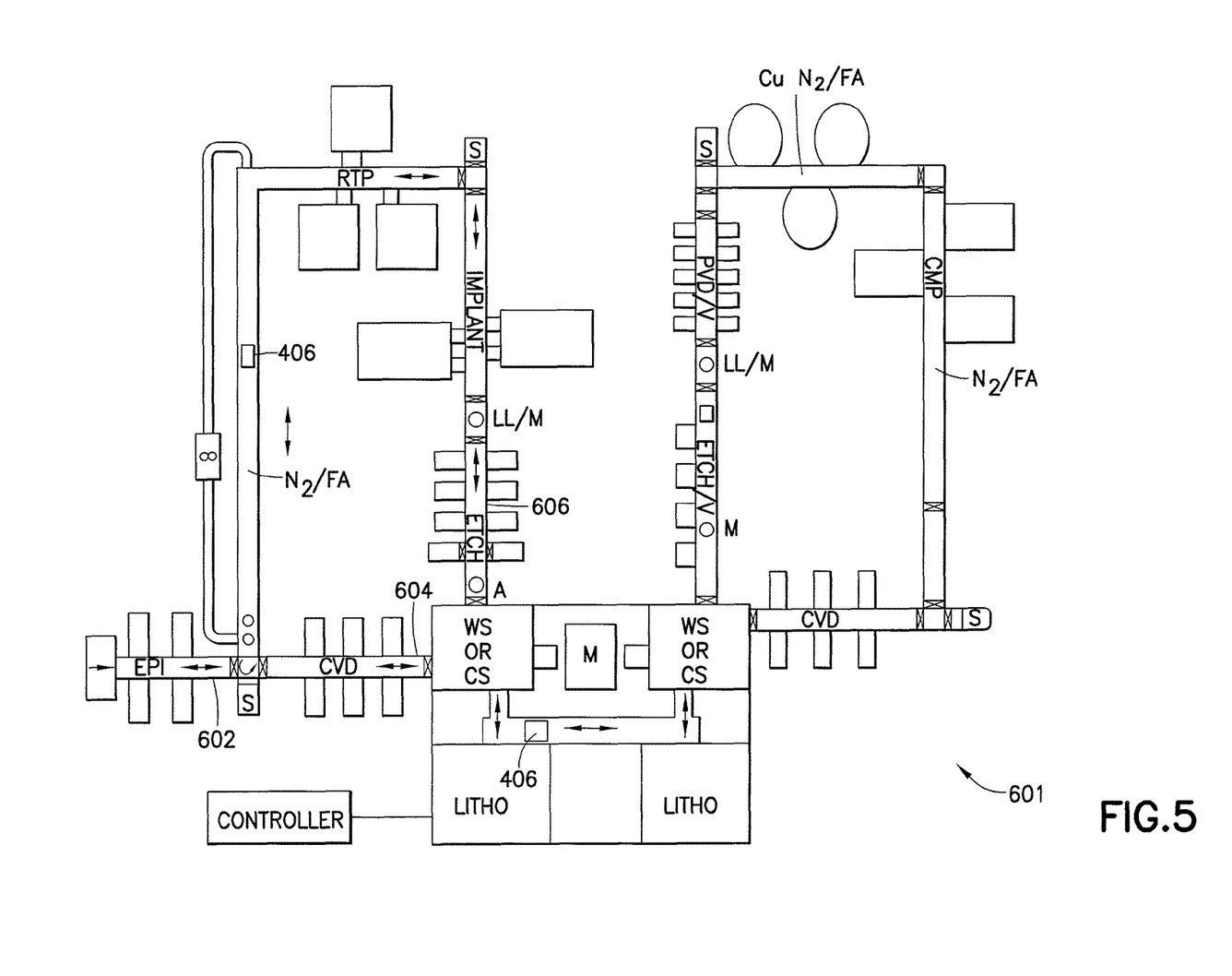
FIG. 5 is a schematic plan view of a substrate processing apparatus in accordance with still yet another exemplary embodiment.

FIG. 5 shows a substrate processing apparatus 601 incorporating features of the present invention in accordance with another exemplary embodiment. Apparatus 601 is shown in FIG. 5 as having an exemplary cartesian or linear tool configuration. A suitable example of a linear tool apparatus is disclosed in U.S. patent application Ser. No. 10/624,987 (filed on Jul. 22, 2003) which is incorporated by reference herein in its entirety. In this embodiment, the transfer chamber 602, 604, 606 has a linear form. The chambers 602, 604, 606 may hold differing isolated environments such as vacuum, nitrogen or inert gas. Load locks 656 and other apparatus such as transfer chambers may be used to transition between one environment and another. Carts 406 with substrate transport apparatus mounted thereon are located in the transport chambers. The carts 406 may be moved through the through transport chambers, for example, 602, 604, 606, and 608 of apparatus 601. Each cart 406 may comprise a substrate transport apparatus (not shown) similar to arm assembly 28. The transport apparatus movable arm assembly may have an end effector (not shown) similar to the end effector show in FIGS. 2-4B and described above. The apparatus 601 may have multiple external wireless devices, similar to devices 200, 210 (see FIGS. 4A, 4B), arrayed serial along the length of the transport chambers. This would allow wireless communication, and hence actuation of the gripping mechanism throughout the extended range of motion of the cart 406 within the linear transport chambers. Moreover, the direct gripper actuation from the transport apparatus motion sensor (similar to sensor 44) and on board microprocessor (similar to microprocessor 300A) simplifies the control communication between the cart 406 and controllers outside the isolated chambers, and by removing ties to outside controllers allows substantially unrestricted travel of the cart 406 throughout apparatus 601.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:
1. A substrate processing apparatus comprising:
a chamber configured to hold an isolated atmosphere;
a drive mechanism connected to the chamber;
a movable arm assembly connected to the drive mechanism and mounted within the chamber, the movable arm assembly having an end effector, the end effector includes a chuck for holding a substrate and an active edge gripper with a contact surface, where an edge of the substrate is gripped by actuating the active edge gripper to engage the substrate with the contact surface;

active edge grip automation on board the movable arm assembly, the active edge grip automation including one of
- an on board motion sensor configured to sense end effector acceleration and send a signal to open and close the active edge gripper based on a predetermined acceleration of the end effector in motion, or
- an on board wireless power supply; and a controller configured to effect actuation of the active edge gripper, to open and close the active edge gripper, in response to at least one of the signal from the on board motion sensor so that actuation of the active edge gripper is effected in the motion of the end effector common to generation of the signal from the on board motion sensor and the actuation of the active edge gripper, or with actuation power transmitted from the on board wireless power supply to the active edge gripper.

2. The substrate processing apparatus of claim 1, further comprising a wireless communication device connected to the controller, wherein the active edge grip automation is configured to open and close the active edge gripper in response to receiving a wireless signal from the wireless communication device.

3. The substrate processing apparatus of claim 2, wherein the wireless communication device is located outside the chamber.

4. The substrate processing apparatus of claim 2, further comprising a wireless communication device, wherein the controller is located outside the chamber and connected to the active edge grip automation through the wireless communication device.

5. The substrate processing apparatus of claim 1, wherein power to actuate the active edge gripper is wirelessly transmitted to the active edge gripper.

6. The substrate processing apparatus of claim 1, further comprising a transport vehicle movably mounted within the chamber, the transport vehicle having a base where the drive mechanism is connected to the base.

7. The substrate processing apparatus of claim 1, wherein the chuck is configured to passively grip the substrate when motion of the end effector is below a predetermined level of acceleration during transport of the substrate.

8. The substrate processing apparatus of claim 1, further comprising an adjustment device for setting a predetermined sensed acceleration that will actuate the active edge gripper.

9. A substrate processing apparatus comprising:
- a chamber configured to hold an isolated atmosphere;
- a drive mechanism connected to the chamber;
- a movable arm assembly connected to the drive mechanism and mounted within the chamber, the movable arm assembly having an end effector, the end effector includes a chuck for holding a substrate and an active edge gripper with a contact surface, where an edge of the substrate is gripped by actuating the active edge gripper to engage the substrate with the contact surface; and
- on board active edge grip closed circuit automation including edge grip actuation power and control that is self-contained and configured so that the on board active edge grip closed circuit automation is closed wholly on board the movable arm assembly and configured to independently effect stand alone, on board the movable arm assembly, control and powering up of active edge grip actuation wholly from the on board active edge grip closed circuit automation independent of a physical link to an off board device.

10. The substrate processing apparatus of claim 9, wherein the off board device comprises a controller and the on board active edge grip automation includes an on board motion sensor configured to sense end effector acceleration and send a signal to open and close the active edge gripper based on a predetermined acceleration, the controller being configured to effect actuation of the active edge gripper, to open and close the active edge gripper, in response to the signal from the on board motion sensor.

11. The substrate processing apparatus of claim 9, wherein the off board device comprises a controller and the on board active edge grip automation includes an on board wireless power supply, the controller being configured to effect actuation of the active edge gripper, to open and close the active edge gripper, with actuation power transmitted from the on board wireless power supply to the active edge gripper.

12. The substrate processing apparatus of claim 9, wherein power to actuate the active edge gripper is wirelessly transmitted to the on board wireless power supply.

13. The substrate processing apparatus of claim 9, further comprising a transport vehicle movably mounted within the chamber, the transport vehicle having a base where the drive mechanism is connected to the base.

14. The substrate processing apparatus of claim 9, wherein the chuck is configured to passively grip the substrate when motion of the end effector is below a predetermined level of acceleration during transport of the substrate.

15. The substrate processing apparatus of claim 9, further comprising an adjustment device for setting a predetermined sensed acceleration that will actuate the active edge gripper.

16. The substrate processing apparatus of claim 9, wherein the on board active edge grip automation includes an accelerometer.

17. The substrate processing apparatus of claim 9, further comprising an adjustment device for setting a predetermined force to be applied to the substrate during actuation of the active edge gripper.

* * * * *